(12) United States Patent
Muyldermans et al.

(10) Patent No.: US 11,555,085 B2
(45) Date of Patent: Jan. 17, 2023

(54) BLOCK COPOLYMERS AND USES THEREOF

(71) Applicant: Kraton Polymers LLC, Houston, TX (US)

(72) Inventors: Xavier Muyldermans, Mont-Saint-Guibert (BE); Ruidong Ding, Houston, TX (US); Frank de Wit, Amsterdam (NL); Koen van Duin, Amsterdam (NL)

(73) Assignee: Kraton Polymers LLC, Houston, TX (US)

( * ) Notice: Subject to any disclaimer, the term of this patent is extended or adjusted under 35 U.S.C. 154(b) by 8 days.

(21) Appl. No.: 16/864,449

(22) Filed: May 1, 2020

(65) Prior Publication Data

US 2020/0347168 A1 Nov. 5, 2020

Related U.S. Application Data

(60) Provisional application No. 62/842,878, filed on May 3, 2019, provisional application No. 63/002,612, filed on Mar. 31, 2020.

(51) Int. Cl.

| | | |
|---|---|---|
| C08F 212/06 | (2006.01) | |
| C08F 232/06 | (2006.01) | |
| B60C 1/00 | (2006.01) | |
| C08F 212/08 | (2006.01) | |
| C08F 236/04 | (2006.01) | |
| C09D 125/10 | (2006.01) | |
| C09D 147/00 | (2006.01) | |
| C08F 236/10 | (2006.01) | |
| C08J 5/24 | (2006.01) | |
| C08F 297/04 | (2006.01) | |
| C08F 293/00 | (2006.01) | |
| C08F 212/36 | (2006.01) | |
| C08F 212/02 | (2006.01) | |
| C08F 212/04 | (2006.01) |

(52) U.S. Cl.
CPC .............. *C08F 232/06* (2013.01); *B60C 1/00* (2013.01); *C08F 212/08* (2013.01); *C08F 212/36* (2013.01); *C08F 236/045* (2013.01); *C08F 236/10* (2013.01); *C08F 293/00* (2013.01); *C08F 293/005* (2013.01); *C08F 297/044* (2013.01); *C08J 5/24* (2013.01); *C09D 125/10* (2013.01); *C09D 147/00* (2013.01); *C08F 212/02* (2013.01); *C08F 212/04* (2013.01); *C08F 212/06* (2013.01); *C08F 297/042* (2013.01); *C08F 297/046* (2013.01); *C08F 297/048* (2013.01); *C08J 2300/206* (2013.01)

(58) Field of Classification Search
CPC .............. C08F 293/00; C08F 293/005; C08F 297/042; C08F 297/044; C08F 297/046; C08F 297/048; C08F 232/06; C08F 212/36; C08F 212/08; C08F 212/06; C08F 212/04; C08F 212/02
See application file for complete search history.

(56) References Cited

U.S. PATENT DOCUMENTS

| | | | |
|---|---|---|---|
| 3,821,148 A * | 6/1974 | Makowski et al. | ...... C08L 51/00 524/297 |
| 4,020,251 A | 4/1977 | Hsieh | |
| 5,571,609 A | 11/1996 | St. Lawrence et al. | |
| 6,071,836 A | 6/2000 | St. Lawrence et al. | |
| 6,130,291 A * | 10/2000 | Kennedy | ............... C08F 297/00 525/244 |
| 6,165,563 A * | 12/2000 | Chandran | .............. C09J 201/02 427/516 |
| 6,512,056 B1 * | 1/2003 | Kennedy | ............... C08F 297/00 525/244 |
| 6,617,398 B2 | 9/2003 | Yegger et al. | |

(Continued)

FOREIGN PATENT DOCUMENTS

| | | |
|---|---|---|
| GB | 2307238 A | 5/1997 |
| JP | H097427 A | 1/1997 |

(Continued)

OTHER PUBLICATIONS

Lu, Chu-Hua et al, "Star block copolyemr Through Nitroxide-Mediated Radical Polymerization From Polyhedral Oligomeric Silsequioxane (POSS) Core", 2010 Macromolecular Chemistry and Physics, 211, 1339-1347 (Year: 2010).*

(Continued)

*Primary Examiner* — Ling Siu Choi
*Assistant Examiner* — David L Miller

(57) ABSTRACT

A polymer composition comprising a star-branched copolymer having a plurality of arms is disclosed. Each polymer arm has a molecular weight Mp of from 1 kg/mol to 50 kg/mol and comprises polymerized units (i) derived from a first vinyl aromatic monomer comprising a radical-reactive group, wherein from greater than 10 mol % to 100 mol % of the units (i) are unhydrogenated; and optionally, polymerized units (ii) comprising hydrogenated and unhydrogenated forms of polymerized units derived from a high Tg monomer, and hydrogenated form of polymerized units (i) or hydrogenated form of polymerized styrene units; and optionally, polymerized units (iii) comprising (a) hydrogenated form of polymerized units derived from one or more acyclic conjugated dienes, and (b) polymerized units derived from one or more of a second vinyl aromatic monomer; wherein less than 10 wt. % of units (a) are unhydrogenated.

11 Claims, No Drawings

(56) References Cited

U.S. PATENT DOCUMENTS

| | | | |
|---|---|---|---|
| 6,699,941 B1* | 3/2004 | Handlin | C08F 8/04 |
| | | | 525/313 |
| 8,519,273 B2 | 8/2013 | Paul et al. | |
| 8,632,874 B2 | 1/2014 | Paul et al. | |
| 9,265,160 B2 | 2/2016 | Paul et al. | |
| 2003/0050395 A1* | 3/2003 | Morishita | C09J 153/025 |
| | | | 525/55 |
| 2005/0239930 A1* | 10/2005 | Clair | C08F 297/044 |
| | | | 524/190 |
| 2008/0221261 A1 | 9/2008 | Amou et al. | |
| 2014/0024278 A1 | 1/2014 | He et al. | |

FOREIGN PATENT DOCUMENTS

| | | | | |
|---|---|---|---|---|
| JP | H0974273 A | | 3/1997 | |
| JP | 2011216244 A | * | 10/2011 | |
| WO | 02/31002 A1 | | 4/2002 | |
| WO | WO-2015175812 A1 | * | 11/2015 | C08C 19/02 |

OTHER PUBLICATIONS

Wang, Lian et al "Surface modification of polystyrene with atomic oxygen radical anions-dissolved solution" 2008 Applied Surface Science 254 p. 4191-4200 (Year: 2008).*

* cited by examiner

BLOCK COPOLYMERS AND USES THEREOF

RELATED APPLICATIONS

This application claims benefit to U.S. provisional applications Ser. No. 62/842,878 with a filing date of May 3, 2019, and Ser. No. 63/002,612, with a filing date of Mar. 31, 2020, the entire disclosure of which are incorporated herein by reference.

FIELD

The present disclosure relates to selectively hydrogenated copolymers, curable and cured compositions made therefrom, and their uses, including high heat applications.

BACKGROUND

The rapid advancement of technologies related to diverse areas, such as electronics and automotive applications, has led to the demand for high performing materials. High capacity computer systems and networks require high frequency signal transmission, with circuit substrates suitable for high frequency and high speed transmission. It is desirable for the circuit substrates to operate signal at high frequency and low transmission loss, e.g., dielectric loss, conductor loss, and radiation loss. Transmission loss weakens electrical signals and destroys signal reliability.

Materials having good mechanical performance with low dissipation factors over a broad temperature range, combined with good processing capabilities are required in numerous areas of commerce, such as the automotive industry, construction, tool manufacture, adhesives and sealants. Some of the major applications require materials having good mechanical performance in term of strength and sufficient modulus or hardness. The existing materials may not be able to meet such requirements.

Printed circuit boards traditionally employ epoxy resin, which has relatively high dielectric constant and high dielectric loss tangent. Epoxy resin can be used in conjunction with phenolic compounds, amines, or acid anhydride curing agents for improved properties. It is still difficult for such resin compositions to achieve low dissipation factor. Polyphenylene ether resin (polyphenylene oxide resin or PPO) has been used in laminate due to its low dissipation property, but the use of high frequency signals in new electronic fields required even lower dielectric constant and dissipation factor. Other plastic solutions exist, e.g. based on fluorinated polymers, with lower dissipation factors but they lack easy processability or efficient curing capabilities to resist at high temperatures or to the presence of solvents.

There is still a need for improved compositions having improved properties, such as improved mechanical properties, high temperature performances and/or improved electrical properties, suitable for use in copper clad laminates and printed circuit boards made therefrom.

SUMMARY

In one aspect, a polymer composition comprising a star-branched copolymer is disclosed. The star-branched copolymer has a plurality of polymer arms, each polymer arm having a molecular weight Mp of from 1 kg/mol to 50 kg/mol. Each polymer arm comprises polymerized units (i), and optionally, polymerized units (ii), and optionally polymerized units (iii). The polymerized units (i) are derived from a first vinyl aromatic monomer containing a radical-reactive group, wherein from greater than 10 mol % to 100 mol % of the polymerized units are unhydrogenated. The polymerized units (ii) comprise hydrogenated and unhydrogenated forms of polymerized units derived from a high Tg monomer, and hydrogenated form of polymerized units (i) or hydrogenated form of polymerized styrene units; and optionally, polymerized units (iii). The polymerized units (iii) comprise (a) hydrogenated form of polymerized units derived from one or more acyclic conjugated dienes, and (b) polymerized units derived from one or more of a second vinyl aromatic monomer, wherein less than 10 wt. % of units (a) are unhydrogenated. The copolymer contains more than 10 wt. % of polymerized units (i), and the polymerized units (i) and (ii) together constitute more than 50 wt. % of the overall weight of the star-branched copolymer. The copolymer has a molecular weight Mp of from 15 kg/mol to 500 kg/mol, and a glass transition temperature of from more than 100° C. to 250° C.

In other aspects, curable compositions comprising the polymer compositions comprising the star-branched copolymer, and cured compositions made from the curable compositions are also disclosed.

DESCRIPTION

Unless otherwise specified, "Molecular weight" refers to the styrene equivalent molecular weight in kg/mol of a polymer or a block copolymer. The molecular weights can be measured with gel permeation chromatography (GPC) using polystyrene calibration standards, such as is done according to ASTM 5296-19. The chromatograph is calibrated using commercially available polystyrene molecular weight standards. The molecular weight of polymers measured using GPC so calibrated are styrene equivalent molecular weights. The detector can be a combination ultraviolet and refractive index detector. The molecular weights expressed herein are measured at the peak of the GPC trace, converted to true molecular weights, and are commonly referred to as "peak molecular weights", designated as Mp. The molecular weights refer to the styrene equivalent peak molecular weights.

Dissipation factor (Df) or tangent delta is defined as the ratio of the equivalent series resistance (ESR) and capacitive reactance. The dissipation factor is also known as the tangent of the loss angle and is commonly expressed in percent.

Dielectric constant (Dk), property of an electrical insulating material (a dielectric) equal to the ratio of the capacitance of a capacitor filled with the given material to the capacitance of an identical capacitor in a vacuum without the dielectric material. The foregoing aspects and other features and advantages of the disclosure will be apparent from the following detailed description.

Polymer Composition:

The polymer composition comprises a star-branched polymer constituting more than 80 wt. % of the polymer composition. In embodiments, the star-branched polymer constitutes from 85-100 wt. %, alternately from 90-95 wt. %, alternately from 95-100 wt. % of the polymer composition. In another embodiment, the polymer composition consists essentially of the star-branched copolymer.

The star-branched copolymer has a plurality of polymer arms. Each polymer arm can have a molecular weight of from 1 kg/mol to 50 kg/mol. Each polymer arm comprises polymerized units (i), optionally polymerized units (ii), and optionally polymerized units (iii). Each of these portions of the star-branched copolymer structure is discussed in detail below.

The polymerized units (i) are derived from a first vinyl aromatic monomer. The first vinyl aromatic monomer has a structure that includes a radical-reactive group. A radical-reactive group is a chemical group that can form, or can be induced to form a free radical species. The free radical species can be formed by any known means, including thermal means, photochemical means, and chemical reagents. For example, a benzylic carbon having at least one hydrogen substituent can be a radical-reactive group. The benzylic carbon group can also be substituted so long as it has one benzylic hydrogen atom. Another example of a radical-reactive group is a cyclobutane ring, which for example, can be photochemically activated to form free radical species. Other examples of radical-reactive groups include an allyl group, which can form allyl free radical.

In an embodiment, the first vinyl aromatic monomer can be a substituted styrene of formula (I), a vinyl benzocyclobutene of formula (II), a vinyl dihydroindene of formula (III), a vinyl tetrahydronaphthalene of formula (IV); or any combination thereof.

TABLE 1

Structures of various first vinyl aromatic monomers.

| Formula | Structure | Definition of Substituents |
|---|---|---|
| I | $CH_2=C(R1)-C_6H_4-C(R2)(R2')H$ | R1 = H or $CH_3$; R2 is H, and R2' is H or a monovalent alkyl group |
| II | $H_2C=C(R^1)$-benzocyclobutene | R1 = H or $CH_3$ |
| III | $H_2C=C(R^1)$-dihydroindene | R1 = H or $CH_3$ |

TABLE 1-continued

Structures of various first vinyl aromatic monomers.

| Formula | Structure | Definition of Substituents |
|---|---|---|
| IV | $H_2C=C(R^1)$-tetrahydronaphthalene | R1 = H or $CH_3$ |

In an embodiment, from greater than 10 mol % to 100 mol % of the units (i) are unhydrogenated. In other embodiment, from 20-90 mol %, or from 30-80 mol %, or from 40-70 mol %, or from 50-60 mol % of the units (i) are unhydrogenated.

Examples of the monomer of formula (I) include o-methylstyrene, p-methyl styrene, o-ethyl styrene, p-ethyl styrene, o-isopropylstyrene, para-isopropyl styrene, o-methyl-α-methylstyrene, p-methyl-α-methylstyrene, o-ethyl-α-methylstyrene, p-ethyl-α-methylstyrene, o-isopropyl-α-methylstyrene, para-isopropyl-α-methylstyrene or any mixture thereof. In an embodiment, the first vinyl aromatic monomer comprises p-methylstyrene, p-methyl-α-methylstyrene, or combinations thereof. In another embodiment, first vinyl aromatic monomer comprises p-methylstyrene.

The polymerized units (ii) are derived from a high Tg monomer, e.g., an anionically polymerizable monomer that when homopolymerized, or copolymerized with other comonomers, can lead to a polymer having a high glass transition temperature (Tg), such as up to 300° C., alternately from 100-250° C., alternately from 110-200° C., alternately from 120-160° C. The high Tg monomer has an anionically polymerizable vinyl group, and can have different types of structures. Non-limiting examples of the high Tg monomer include compounds selected from the group consisting of tert-butylstyrene, 1,3-cyclohexadiene, benzofulvene, 1,1-diphenylethylene, vinyl biphenyl, adamantyl styrene, vinylanthracene, divinylbenzene, bis(vinylphenyl)ethane, and combinations thereof. The aromatic ring in the monomers can also be bicyclic, tricyclic, or polycyclic. The polymerizable vinyl group can also be contained within a ring, such as for example, indene or a substituted derivative thereof.

Other examples of the high Tg monomer include a conjugated cyclodiene, such as 1,3-cyclohexadiene, 1,3-cycloheptadiene, substituted derivatives thereof, or combinations thereof 1,3-Cycohexadiene is preferred as it is relatively more readily available.

When a conjugated cyclodiene is used as the high Tg monomer, anionic polymerization can proceed through varying extents of 1,4-addition mechanism and 1,2-addition mechanisms. The ratio can be influenced not only by monomer structure, but also by other additives present during polymerization. For example, an additive can be used to enhance 1,2-addition over the 1,4-addition. In an embodiment, the polymerized units derived from the conjugated cyclodiene, such as 1,3-cyclohexadiene, or any of the high Tg monomers listed previously, can comprise 1,2- and 1,4-polymerized units in a relative mole ratio of from 90:10 to 10:90, or from 85:15 to 15:85, or from 80:20 to 20:80, or from 70:30 to 30:70, or from 60:40 to 40:60, or from 55:45 to 45:55. In a particular embodiment, the 1,2- and 1,4- polymerized units derived from 1,3-cyclohexadiene can vary in a relative mole ratio of from 90:10 to 10:90. For example, an additive like TMEDA is known to lead to 1,2- and 1,4-polymerized units in a relative mole ratio close to 50/50 content. A modifier like DEP can, for example, lead to a 1,2 to 1,4 ratio closer to 30/70, and a modifier like DABCO can provide a 1,2 to 1,4 ratio closer to 10/90.

In polymer compositions comprising a star-branched polymer comprising polymerized units (i) and (ii), the copolymer can contain more than 10 wt. % of polymerized units (i), such that the polymerized units (i) and (ii) together constitute more than 50 wt. % of the overall weight of the copolymer, alternately more than 60 wt. %, alternately more than 70 wt. %, alternately more than 80 wt. %, alternately more than 90 wt. %, alternately essentially 100 wt. % of the overall weight of the copolymer.

In another embodiment, the polymer compositions comprising a star-branched polymer comprise polymerized units (i), (ii), and (iii), containing more than 10 wt. % of polymerized units (i), such that the polymerized units (i) and (ii) together constitute more than 50 wt. % of the overall weight of the copolymer, alternately more than 60 wt. %, alternately more than 70 wt. %, alternately more than 80 wt. %, alternately more than 90 wt. % of the overall weight of the copolymer.

The polymer compositions comprising polymerized units (i) derived from the first vinyl aromatic monomer comprising the radical-reactive group listed in Table 1 exhibit a solution viscosity, measured as a 25 wt. % solution in toluene, at 25° C., of less than 5000, alternately less than 2000 centipoise, alternately from 200-1800 centipoise, alternately from 400-1500 centipoise, alternately from 600-1200 centipoise, alternately from 800-1000 centipoise.

In another embodiment, the star-branched copolymer has a molecular weight of more than 30 kg/mol, and a solution viscosity measured at 25° C. and at 25 wt. % copolymer content in toluene of less than 2,000 centipoise.

In some embodiments, the star-branched copolymer has a structure where prior to hydrogenation, the polymerized units of type (i) are polymerized para-methylstyrene units. In another embodiment, the copolymer has a structure wherein the first vinyl aromatic monomer is para-methylstyrene, and the polymerized units (ii) comprise hydrogenated forms of polymerized para-methyl styrene, polymerized divinyl benzene, polymerized tert-butylstyrene, or combinations thereof and wherein the polymerized units (i) and (ii) together constitute more than 60 wt. %, or 60-100 wt. %, or 70-95 wt. %, 75-90 wt. %, or 80-90 wt. %, of the overall weight of the copolymer. In still other embodiments, the copolymer contains more than 10 wt. % of polymerized units (i), such that when polymerized units (ii) are also present, the units (i) and (ii) together constitute more than 50 wt. % of the overall weight of the copolymer.

The star-branched copolymer can also, optionally, comprise polymerized units (iii) comprising (a) hydrogenated form of polymerized units derived from one or more acyclic conjugated dienes, and (b) polymerized units derived from one or more of a second vinyl aromatic monomer, wherein less than 10 wt. % of (a) are unhydrogenated. In an embodiment, the conjugated diene is an acyclic 1,3-diene, non-limiting examples of which include 2,3-dimethyl-1,3-butadiene, butadiene, isoprene, 1,3-pentadiene, farnesene, myrcene, 1,3-hexadiene, and combinations thereof. The second vinyl aromatic monomer can be any anionically polymerizable aromatic compound, such as styrene, a substituted styrene, or other vinyl aromatic compounds. When an acyclic 1,3-diene is used, it allows for introducing a polymer block having a low glass transition temperature, i.e., a polymer soft block at room temperature or at the application temperature. In embodiments, the relative proportion of the polymerized units derived from the second vinyl aromatic monomer and the conjugated diene can vary in a mole ratio from 100:0 to 0:100. Using none or a low amount, e.g., up to less than 50 mol %, of the second vinyl aromatic monomer can be useful for making a soft polymer block having a lower Tg.

The star-branched copolymer has a molecular weight Mp of from 15-500 kg/mol. In other embodiments, the copolymer has a molecular weight of from 30-400 kg/mol, alternately from 50-200 kg/mol. The copolymer has a Tg of from 100-250° C. In embodiments, the Tg can vary in a range from 110-225° C., or from 150-200° C.

In another embodiment, the star-branched copolymer structure can comprise polymerized units (ii) that are derived from 1,3-cyclohexadiene, and comprise 1,2- and 1,4-addition units in a relative mole ratio of from 90:10 to 10:90. The ratio of 1,2- to 1,4-addition of a diene monomer can in general be controlled using certain types of additives, as explained previously. In another embodiment, the star-branched copolymer can have a structure wherein more than 50 mol %, or 50-100 mol %, or 60-90 mol %, or 70-80 mol % of the polymerized 1,3-cyclohexadiene units are hydrogenated. In yet another embodiment, the copolymer can further comprise polymerized units (iii) wherein the second vinyl aromatic monomer is styrene, and the acyclic conjugated diene is selected from the group consisting of butadiene, isoprene, and combinations thereof.

In an embodiment, the star-branched copolymer can be a star-branched block copolymer, where the each of the plurality of polymer arms can comprise one or more polymer blocks comprising polymerized units (i) derived from the first vinyl aromatic monomer, and optionally, polymerized units (ii), and optionally polymerized units (iii), as described previously. In a particular embodiment, the star-branched block copolymer has a structure wherein more than 70 wt. % of the one or more polymer blocks comprise at least 80 wt. % of a combination of polymerized units (i) and (ii); and wherein the polymer composition has a hardness of more than 80 Shore A, measured according to ASTM D2240. In other embodiments, the block copolymer has a structure wherein from 75-100 wt. %, or from 80-95 wt. %, or 85-90 wt. % of the one or more polymer blocks comprise at least 80 wt. % of the combination of polymerized units (i) and (ii), and the polymer composition has a hardness of more than 80 Shore A, measured according to ASTM D2240.

In still other embodiments, the block copolymer has a structure wherein more than 70 wt. % of the one or more polymer blocks comprise from 85-100 wt. %, or from 90-95 wt. % of a combination of polymerized units (i) and (ii), and the polymer composition has a hardness of more than 80 Shore A, measured according to ASTM D2240.

In another embodiment, the polymer composition comprises a star-branched copolymer comprising one or more polymer blocks "D" comprising polymerized units (i), and optionally one or more polymer blocks "E" comprising polymerized units (ii), and optionally one or more polymer blocks "F" comprising polymerized units (iii), where the polymerized units (i) and (iii) are as explained previously.

In an embodiment, the star-branched block copolymer has a structure wherein the one or more blocks "D" comprises more than 50 wt. % of polymerized units (i), the one or more blocks "E" comprises more than 50 wt. % of polymerized units (ii), and the one or more blocks "F" comprises more than 50 wt. % of polymerized units (iii); and wherein the polymer composition has one or more configurations selected from the group consisting of (D-)$_n$X, (D-E-)$_n$X, (D-F-)$_n$X, (E-D-)$_n$X, (F-D-)$_n$X, (D-E-D-)$_n$X, (D-F-E-)nX, (D-E-F-)nX, (E-F-D-)nX, and (E-D-F-)nX; wherein "n" is an integer from 2 to 50, and X is a coupling agent residue.

In an embodiment, the block "D" comprises hydrogenated forms of polymerized para-methylstyrene units. The high Tg monomer for the polymerized units (ii) can be 1,3-cyclohexadiene as it is relatively more readily available. In another embodiment, the block "E" can further comprise polymerized units derived from an acyclic 1,3-diene, such as 2,3-dimethyl-1,3-butadiene, isoprene, butadiene, 1,3-pentadiene, farnesene, myrcene, 1,3-hexadiene, and combinations thereof.

In another embodiment, the block "E" comprises hydrogenated forms of polymerized units (ii) derived from the high Tg monomers 1,3-cyclohexadiene, para-methyl styrene, or divinylbenzene.

The one or more polymer blocks "F" can comprise hydrogenated forms of polymerized units derived from butadiene or isoprene. As indicated before, the relative mole ratio of the second vinyl aromatic monomer and the acyclic conjugated diene can vary from 100:0 to 0:100, alternately from 90:10 to 10:90, alternately from 80:20 to 20:80, alternately from 70:30 to 30:70.

In an embodiment, the star-branched block copolymer, having one or more blocks "D", and optionally one or more blocks "E", and optionally one or more blocks "F", has an overall molecular weight of from 25 kg/mol to 300 kg/mol, and a polymer arm molecular weight of from 1 kg/mol to 30 kg/mol. In other embodiments, the copolymer having one or more blocks "D", and optionally one or more blocks "E", and optionally one or more blocks "F" has an overall molecular weight of from 50-250 kg/mol, or from 100-200 kg/mol, or from 125-150 kg/mol. Further, the polymer arm molecular weight can vary in a range from 3-25 kg/mol, or from 6-20 kg/mol, or from 10-18 kg/mol.

The star-branched copolymers discussed above can be obtained from a variety of precursor copolymers, which are also star-branched. Some examples of precursor copolymers are shown in Table 2 where the following abbreviations and notations are used: X: residue of divinylbenzene (DVB), used as coupling agent; p-MeS: para-methylstyrene; DPE: 1,1-diphenylethylene; CHD: 1,3-cyclohexadiene; p-tBuS: para-tert-butyl styrene; p-AdS: para-adamantyl styrene; S: styrene; VBCB: 4-vinyl benzocyclobutene; BD: 1,3-butadiene; TMOS: Tetramethoxysilane The above precursor copolymers can be selectively hydrogenated to provide the desired star-branched copolymers having varying levels of hydrogenated and unhydrogenated forms of the polymerized units (i), and optionally (ii), and optionally (iii). In an embodiment, the polymerized units derived from the first vinyl monomer discussed above can be selectively hydrogenated, wherein from greater than 10 mol % to 100 mol %, alternately from 20 mol % to 90 mol %, alternately from 30 mol % to 70 mol %, alternately from 40 mol % to 60 mol % of the polymerized units are in unhydrogenated form. In copolymers where the polymerized units (ii) are derived from a 1,3-cyclodiene, selective hydrogenation can also lead to structures where some or all of the diene double bonds in the polymerized cyclodiene units are reduced. In copolymers which include polymerized units (iii), selective hydrogenation can result in reduction of essentially all of the acyclic diene double bonds, with essentially no reduction, i.e., no more than 10 mol %, alternately no more than 5 mol %, alternately no more than 2 mol % of the aromatic double bonds hydrogenated. When more than one type of vinyl aromatic monomer is used to make the unhydrogenated copolymer, selective hydrogenation can proceed to various extents in each type of polymerized vinyl aromatic unit.

Examples of selectively hydrogenated copolymers that can be obtained from the precursor copolymers listed in Table 2 are shown in Table 3. In Table 3, the selectively hydrogenated form of the polymerized unit is denoted by the prefix "h" placed before the abbreviation for the polymerized unit that is subject to hydrogenation. For example, "hpMeS" means selectively hydrogenated form of polymerized para-methylstyrene units.

TABLE 2

Structure and examples of various copolymers.

| Polymerized unit (i) monomer | Polymerized unit (ii) monomer | Polymerized unit (iii) monomer | Coupling agent | Polymer Structure |
| --- | --- | --- | --- | --- |
| pMeS | | BD | DVB | Star poly[(pMeS-block-(pMeS-co-BD)]nX |
| pMeS | DPE &DVB | Not used | DVB | Star poly(pMes-co-DPE)nX |
| pMeS | CHD & DVB | Not used | DVB | Star poly(pMeS-co-/CHD)nX |
| pMeS | ptBuS & DVB | Not used | DVB | Star poly[(pMeS-co-p-tBuS)]nX |
| pMeS | tBuS & DVB | Not used | DVB | Star (pMeS-block-ptBuS)nX |
| VBCB | CHD & DVB | Not used | DVB | Star poly(VBCB-block-CHD)nX |
| pMeS | pAdS & DVB | Not used | DVB | Star poly(pMeS-co--pAdS)nX |
| pMeS | DPE & DVB | styrene | DVB | Star poly[(pMeS-block-(DPE-co-S)]nX |
| pMeS | CHD | BD | DVB | Star poly(pMeS-block-CHD-block-BD)nX |
| p-MeS | Not used | BD | TMOS | Star poly(pMeS-block-BD)nX |

TABLE 3

Selectively hydrogenated star-branched copolymers made from the copolymers listed in Table 2.

| Precursor star-branched copolymer | Polymer Structure after selective hydrogenation | Polymer example |
|---|---|---|
| Star poly[(pMeS-block-(pMeS-co-BD)]nX | Star poly[(pMeS-block-(pMeS-co-hBD)]nX | A |
| Star poly(pMes-co-DPE)nX | Star poly(hpMes-co-hDPE)nX | B |
| Star poly(pMeS-co-/CHD)nX | Star poly(pMeS-co-hCHD)nX | C |
| Star poly[(pMeS-co-ptBuS)]nX | Star poly[(hpMeS-co-hptBuS)]nX | D |
| Star (pMeS-block-ptBuS)nX | Star (hpMeS-block-hptBuS)nX | E |
| Star poly(VBCB-block-CHD)nX | Star poly(VBCB-block-hCHD)nX | F |
| Star poly(pMeS-co-pAdS)nX | Star poly(hpMeS-co-hpAdS)nX | G |
| Star poly[(pMeS-block-(DPE-co-S)]nX | Star poly[(hpMeS-block-(hDPE-co-hS)]nX | H |
| Star poly(pMeS-block-CHD-block-BD)nX | Star poly(pMeS-block-hCHD-block-hBD)nX | I |
| Star-branched poly(pMeS-block-BD)nX | Star branched poly(pMeS-block-hBD)nX | J |

Preparation of the Copolymer:

The copolymers are prepared by anionic polymerization using methods known in the art. The polymerization initiator is generally an organometallic compound, such as organolithium compounds, example, ethyl-, propyl-, isopropyl-, n-butyl-, sec-butyl-, tert-butyl-, phenyl-, hexylbiphenyl-, hexamethylenedi-, butadieneyl-, isopreneyl-, 1,1-diphenyl-hexyllithium, or polystyryllithium. The amount of initiator needed is calculated based on the molecular weight to be achieved, generally from 0.002 to 5 mol percent, based on the amount of monomer to be polymerized. Suitable solvents include aliphatic, cycloaliphatic or aromatic hydrocarbons having from 4 to 12 carbon atoms, such as pentane, hexane, heptane, cyclopentane, cyclohexane, methylcyclohexane, decalin, isooctane, benzene, alkylbenzenes, such as toluene, xylene or ethylbenzene, or suitable mixtures. Polymer chain termination is carried out using a anion quenching agent, such as methanol, or by using a coupling agent, such as bi- or polyfunctional compounds, for example divinylbenzene, halides of aliphatic or araliphatic hydrocarbons, such as 1,2-dibromoethane, bis(chloromethyl)benzene, or silicon tetrachloride, dialkyl- or diarylsilicon dichloride, alkyl- or arylsilicon trichloride, tin tetrachloride, alkyl silicon methoxides, alkyl silicon ethoxides, polyfunctional aldehydes, such as terephthalic dialdehyde, ketones, esters, anhydrides or epoxides. Multifunctional coupling agents, e.g., divinylbenzene are preferred as they give rise to the desired star-branched copolymer structure.

If desired, a Lewis base additive, which affects polymerization parameters, such as the relative proportion of 1,2-addition versus 1,4-addition, can also be employed. Examples of Lewis bases include dimethyl ether, diethyl ether, ethylene glycol dimethyl ether, 1,2-diethoxypropane, diethylene glycol dimethyl ether, tetrahydrofuran, tetrahydrofurfuryl ethers, such as tetrahydrofurfuryl methyl ether, and tertiary amines.

Hydrogenation of the double bonds in the polymerized units can be carried out under controlled conditions so as to obtain the selectively hydrogenated copolymer having the desired percent of hydrogenation. A suitable catalyst based on nickel, cobalt or titanium is used in the hydrogenation step. The hydrogenated polymer may be isolated and recovered by solvent evaporation under deep vacuum and at a relative high temperature to fully remove any trapped solvent used for the hydrogenation The conditions can be varied to achieve any of the selectively hydrogenated copolymers described above. In an embodiment, when a diene monomer is included to make the copolymer, hydrogenation can be carried out such that at least 80 mol %, at least 90 mol %, or at least 98 mol % of the double bonds in the polymerized diene units are reduced, and 0-10 mol % of the arene double bonds are reduced. Similarly, the reaction conditions can be adjusted to produce selectively hydrogenated copolymers when selective hydrogenation of the aromatic double bonds in the polymerized vinyl aromatic monomer is desired.

Curable Compositions:

The copolymers described above can be used for producing curable compositions and cured compositions made therefrom. The curable composition comprises the polymer composition described above, a curing agent, a co-curing agent, and optionally, one or more additives.

The curable composition comprises a sufficient amount of the copolymer so as to have the desired properties, such as for example, modulus, toughness, viscosity, glass transition temperature, gel content, hardness, Dk, Df, and flame retardance. The amount ranges from 1-99.5 wt. %, or 7-50 wt. %; or 10-25 wt. % of polymer based on the total weight of the curable composition. Based on the desired end-use, the curable composition can further contain different components as described below.

Curing Agent/Curing Initiator:

The curable composition further comprises at least one curing agent/curing initiator. Examples include, but are not limited to, azides, peroxides, sulfur, and sulfur derivatives. Free radical initiators are especially desirable as cure initiators. Examples of free radical initiators include peroxides, hydroperoxides, and non-peroxide initiators such as 2,3-dimethyl-2,3-diphenyl butane. Examples of peroxide curing agents include dicumyl peroxide, alpha, alpha-di(t-butylperoxy)-m, p-diisopropylbenzene, 2,5-dimethyl-2,5-di(t-butylperoxy)hexane, and 2,5-di(tert-butylperoxy)-2,5-dimethyl-3-hexyne, and mixtures comprising one or more of the foregoing cure initiators.

In embodiments, the cure initiator is used in an amount of 0.1-10 parts, or 0.3 to 7 parts, or 1 to 5 parts, or 0.1 to 5 parts, per 100 parts of the curable composition.

Co-curing agents can also be used if needed. Examples include styrene, bromostyrene, divinylbenzene, 1,2-bis(vinylphenyl)ethane, triallyl cyanurate, triallyl isocyanurate, vinyl functionalized polyphenylene ether resin, bismaleimide resin, a liquid or a solid diene-based polymer, acrylates such as trimethylolpropane triacrylate; diallylphthalate, epoxy resins, a diene-based polymer component, a solid diene-based polymer, styrene-butadiene diblock resins, and polybutadiene resins.

The diene based polymer can be, e.g., homopolymers of dienes, or copolymers (including triblock copolymers) of different alkenes and/or dienes, with a double bond in the polymer main chain. The diene-based polymer can be in liquid state or solid state at room temperature, including unsaturated resins for dielectric substrates such as a polybutadiene polymer, or the copolymer of butadiene with styrene or the like styrenic monomers.

Examples include a polybutadiene rubber that includes a (meth)acryloyl group, a polyisoprene rubber that includes a (meth)acryloyl group, a copolymer rubber of butadiene and isoprene that includes a (meth)acryloyl group, a copolymer rubber of butadiene and n-butene that includes a (meth) acryloyl group, and the like. In embodiments, the diene-based polymer is selected from polybutadiene, polyisoprene, butadiene-styrene copolymers, isoprene-styrene copolymers, tri-block copolymers of butadiene-styrene-methacrylate, butadiene-styrene-divinylbenzene, butadiene-styrene-acrylonitrile copolymer, butadiene-styrene-maleic anhydride copolymer and any combination thereof.

Examples of liquid butadiene copolymers are butadiene-co-styrene and butadiene-co-acrylonitrile. The unsaturated butadiene- or isoprene-containing polymer may also contain a second block copolymer similar to the first except that the polybutadiene or polyisoprene block is hydrogenated, thereby forming a polyethylene block (in the case of polybutadiene) or an ethylene-propylene copolymer (in the case of polyisoprene).

In embodiments, the diene-based resin optionally comprises functionalized liquid polybutadiene or polyisoprene resins, e.g., an unhydrogenated block copolymer containing the residue of one or more acid functionalizing agents, such as epoxy, maleate, hydroxyl, carboxyl and methacrylate.

The diene-based polymer may be present in the curable composition in an amount ranging from 1-99 wt. %, 30-70 wt. %, 5-25 wt. %, 7-20 wt. %, or 10-15 wt. %, all on a dry weight basis.

Filler Component:

The curable composition further comprises at least an inorganic and/or organic filler. Inorganic filler can be used for suppressing the thermal expansion coefficient and improving the toughness of the laminated sheets. Organic fillers can be used to reduce the dielectric constant of laminated sheets. Fillers having low coefficient of thermal expansion are preferred.

Exemplary fillers include titanium dioxide (rutile and anatase), barium titanate, strontium titanate, silica, including fused amorphous silica, corundum, wollastonite, aramide fibers, fiberglass, $Ba_2Ti_9O_{20}$, glass spheres, quartz, boron nitride, aluminum nitride, silicon carbide, beryllia, alumina, magnesia, magnesium hydroxide, melamine polyphosphate, melamine cyanurate, Melam, Melon, Melem, guanidines, phosphazanes, silazanes, DOPO (9,10-dihydro-9-oxa-10 phosphenathrene-10-oxide), DOPO (10-5 dihydroxyphenyl, 10-H-9 oxaphosphaphenanthrenelo-oxide), mica, talcs, nanoclays, aluminosilicates (natural and synthetic), and fumed silicon dioxide, used alone or in combination.

Examples of organic fillers include fluorine-based, polystyrene-based, divinylbenzene-based, and polyimide-based fillers. Fluorine-based fillers include polytetrafluoroethylene (PTFE), polyperfluoroalkoxy resins, polyethylenefluoride-propylene resins, polytetrafluoroethylene-polyethylene copolymers, polyvinylidene fluoride, polychlorotrifluoro-ethylene resins or the like.

In embodiments, the filler can be treated with one or more coupling agents, such as silanes, zirconates, or titanates. The filler can be pretreated, or the coupling agent can be added to the curable composition.

The amount of fillers ranges up to 75 wt. %, or from 0 to 60 wt. %, or from 5 to 50 wt. %, or at least 20 wt. %.

Flame Retardants:

In embodiments, the curable composition comprises flame retardant selected from phosphorous-containing flame retardants and brominated flame retardants. Examples of brominated flame retardant include ethylene-bis(tetrabromophthalimide), 1,2-bis(pentabromophenyl) ethane, and 2,4,6-tris(2,4,6-tribromophenoxy)-1,3,5-triazine. Examples of phosphorous-containing flame retardants include bisphenol diphenyl phosphate, ammonium polyphosphate, hydroquinone bis-(diphenyl phosphate), bisphenol A bis-(diphenylphosphate), tri(2-carboxyethyl)phosphine (TCEP), tri (chloroisopropyl) phosphate, trimethyl phosphate (TMP), dimethyl methyl phosphonate (DMMP), resorcinol bis(dixylenyl phosphate), phosphazene, melamine polyphosphate, 9,10-dihydro-9-oxa-10-phosphaphenanthrene-10-oxide (DOPO) and its derivative or resin, melamine cyanurate and tri-hydroxy ethyl isocyanurate. In embodiments, the flame retardant compound may be a DOPO compound, DOPO resin (e.g. DOPO-HQ, DOPO-NQ, DOPO-PN, and DOPO-BPN), and DOPO-containing epoxy resin, wherein DOPO-BPN may be bisphenol novolac compounds such as DOPO-BPAN, DOPO-BPFN, and DOPO-BPSN.

In embodiments, the flame retardant a non-reactive flame retardant, which does not contain a reactive functional group in its chemical structure. The amount of flame retardant ranges from 2 to 30 wt. % with respect to the total amount of the curable composition.

Solvent:

In manufacturing, solvent is added to change the solid content of the curable composition and to adjust the viscosity. Suitable solvents include, for example, ketones such as methylethylketone or the like, ethers such as dibutylether or the like, esters such as ethyl acetate or the like, amides such as dimethylformamide or the like, aromatic hydrocarbons such as benzene, toluene, xylene or the like, and chlorinated hydrocarbons such as trichloroethylene or the like; each solvent can be used alone or in combination thereof.

Preferred solvents are selected from the group of methanol, ethanol, ethylene glycol methyl ether, acetone, methyl ethyl ketone, methyl isobutyl ketone, cyclohexanone, toluene, xylene, methoxyethyl acetate, ethoxyethyl acetate, propoxyethyl acetate, ethyl acetate, dimethylformamide, propylene glycol methyl ether, gamma-butyrolactone (GBL) and diisobutyl ketone (DIBK).

In an embodiment, a formulation comprising the curable composition having the star-branched copolymer described above, can be prepared using a suitable solvent, such as for example, toluene, methyl ethyl ketone, or ketone. In another embodiment, the formulation has from 10 wt. % to 60 wt. %, or from 15 wt. % to 40 wt. %, or from 20-30 wt. % of the curable composition, and wherein the formulation has a solution viscosity of less than 5000 cP, alternately less than 2000 cP, alternately from 200-1800 centipoise, alternately from 400-1500 centipoise, alternately from 600-1200 centipoise, alternately from 800-1000 centipoise, measured at 25° C. The formulation can subsequently be converted into a cured composition. The amount of solvent used is dependent on the solubility of the components, the filler amount, the method of application, and other factors.

Other Additives:

In embodiments, the curable composition may further include at least one of the following additives: a polyolefin having a glass transition temperature of from 100° C. to 200° C., an aromatic resin, a rubber, an antioxidant, a UV stabilizer, a UV radical initiator, an anti-shrink additive, an adhesion promoter, a colorant, and combinations thereof, tougheners, adhesion promoters, e.g., silanes; anti-shrink additives, and the like. The choice of additives depends upon the application, and the desired properties, selected so as to enhance or not substantially adversely affect the electrical properties of the circuit sub-assemblies, such as dielectric constant, dissipation factor, dielectric loss, and/or other desired properties. In embodiments, the polymer composition comprises a curing agent, a co-curing agent, and one or more additives, wherein the co-curing agent is selected from the group consisting of divinylbenzene, 1,2-bis(vinylphenyl) ethane, triallyl cyanurate, triallyl isocyanurate, vinyl functionalized polyphenylene ether resin, bismaleimide resin, a liquid or a solid diene-based polymer; and the additive is selected from the group consisting of a filler, a fire retardant, a polyolefin having a glass transition temperature of from 100° C. to 200° C., an aromatic resin, a rubber, an antioxidant, a UV stabilizer, a UV radical initiator, an anti-shrink additive, an adhesion promoter, a colorant, and combinations thereof.

A curing accelerator can be added to increase the reaction rate of the curable composition. Surfactant helps ensure uniform distribution of the inorganic filler in the curable composition and to avoid aggregation of the inorganic filler. Toughener helps improve the toughness of the curable composition.

The toughener may be rubber resin, carboxyl-terminated polybutadiene acrylonitrile, and/or core-shell polymer. Exemplary antioxidants include radical scavengers and metal deactivators. Coupling agents can be present to promote the formation of or participate in covalent bonds connecting a metal surface or filler surface with a polymer. Exemplary coupling agents include 3-mercaptopropylmethyldimethoxy silane and 3-mercaptopropyltrimethoxy silane and hexamethylenedisilazanes.

The curable composition may comprise a catalyst, such as a Lewis base or a Lewis acid. The Lewis base includes imidazole, boron trifluoride amine complex, ethyltriphenylphosphonium chloride, 2-methylimidazole, 2-phenylimidazole, 2-ethyl-4-methylimidazole, triphenylphosphine, and/or 4-dimethylaminopyridine. The Lewis acid comprises a metal salt compound, such as a manganese, iron, cobalt, nickel, copper, or zinc metal salt compound, preferably a metal catalyst such as zinc caprylate or cobalt caprylate. The coupling agent may be silane and/or siloxane compound. Preferably, the coupling agent is at least one of an amino silane compound, an amino siloxane compound, a styrene-based silane compound, a styrene-based siloxane compound, an acrylic silane compound, an acrylic siloxane compound, a methacrylic silane compound, a methacrylic siloxane compound, an alkyl silane compound and an alkyl siloxane compound.

In embodiments, the amount of optional components ranges from 0.01 to 5 wt. %, or 0.001 to 0.1 wt. %, or 5 to 10 wt. %, or less than 20 wt. %.

Cured Resin Compositions and their Uses:

The curable compositions can be processed, dried and further cured into cured product. The cured products have desirable properties such as a fixed shape, good resistance to solvent and temperature, high gel content, low swell ratio, and low Dk/Df. The resins compositions are valuable in copper clad laminates (CCL), printed circuit boards, LED, other electronic coatings, tires, textiles, polymer molding compounds, medical molding compounds. Printed circuit boards are produced by impregnating a supporting or reinforcing material (e.g., glass based fiber, woven fabric, cross-ply laminate) with the resin, followed by the resin being cured partially or wholly forming prepregs. Then the prepregs are laminated with copper foil in between and cured at a temperature between 150° C. to 250° C. and pressure of 25 Kg/cm$^2$ to 70 Kg/cm$^2$, thereby forming the circuit substrate. To make laminates, one or more layers of prepregs are laminated with one or more layers of copper.

Properties and Uses:

The polymer compositions described above have very good dielectric properties, which makes them valuable for making curable compositions and cured compositions for a variety of applications. In an embodiment, the composition has a dielectric constant Dk, measured at 1 GHz, of less than 3; and a dissipation factor Df, measured at 1 GHz, of less than 0.002. In other embodiments, the composition has a Dk measured at 1 GHz of from 0.5-4, or from 1-3, or from 1.5-2.5. The Df value measured at 1 GHz can be from 0.0005-0.002, or from 0.001-0.0018.

Curable resin compositions, suitable for electronic applications, have a low viscosity, and good solubility in solvents such as hydrocarbon solvents, e.g., cyclohexane, toluene, xylene, and the like. The curable resins can be quickly cured and gelled to provide cured resins having high Tg, e.g., greater than 100° C. and a low swell ratio once immersed into a solvent.

The cured composition is characterized as have a low dielectric loss, in particular a dissipation factor of less than or equal to 0.03, less than or equal to 0.02, or less than 0.003, all measured at 1 gigahertz. The above-described dielectric materials also have a low CTE (coefficient of thermal expansion), of less than or equal to 80 ppm/° C., less than or equal to 60 ppm/° C., or less than or equal to 50 ppm/° C., all measured over 0 to 150° C.

In embodiments, the cured composition has a gel content of from 80 wt. % to 100 wt. %, relative to the overall weight of the cured composition, and a swell ratio of below 10, or from 1-5, or from 1.5-3; a hardness of from 90 to 100 ShoreA, measured according to ASTM D2240; a dielectric constant Dk, measured at 1 GHz, of less than 4, or 0.5-4, or from 1-3.7, or from 1.5-2.5; and a dissipation factor Df, measured at 1 GHz, of less than 0.004, or 0.0005-0.003, or from 0.001-0.0018. In another embodiment, the swell ratio is below 3.

The cured composition also has good thermal conductivity, on the order of 0.2 to 0.7 Watts per meter-Kelvin (W/mK), or 0.3 to 0.5 W/mK.

The cured compositions can further have low moisture absorption, which results in a package substrate that is less sensitive to environmental conditions both in use and during storage. In one embodiment, the moisture absorption is 0.05-0.3 percent after immersion in water at 23° C. for 24 hours.

The cured compositions have good flame retardance. In an embodiment, the compositions can attain a UL 94 rating of V-0. In another embodiment, the compositions exhibit a V-0 rating in the absence of brominated or chlorinated flame retardants.

The cured compositions also have a relatively low modulus and high elongation. This is particularly helpful in the reliability of copper interconnects as it prevents excessive stress from being imparted on the walls of copper plated vias as the parts are thermally cycled. In one embodiment, the tensile modulus of is less than 3000 MPa. In another embodiment, the elongation is greater than 5%.

The cured compositions are used in a variety of applications, such as copper clad laminates, printed circuit boards, LED, electronic coatings, textiles, polymer molding compounds, and medical molding compounds.

The curable resin compositions can also be combined with a tire rubber mixture and co-cured to provide tire rubber compositions. Tire components made using the composition have good properties, such as good wet traction, dry handling, good skid resistance, low rolling resistance, and the like.

EXAMPLES

The following examples are provided to illustrate the disclosure, and not intended to limit the scope of the disclosure.

Polymer Composition 1 (Ex 1)

Preparation of star branched coupled block copolymer (PMeS)xDVB. In a glass pressure vessel, 400 ml of purified and dried cyclohexane solvent was charged and 7.1 ml of sec-Buli 0.0036 molar was added after which the mixture was heated to 50° C. and 25 gr purified and dried p-methylstyrene was added. The reaction was allowed to proceed for 2 hours and a first small sample was collected from the solution for GPC analysis and NMR. The NMR confirmed the complete polymerization of this first monomer. Then, 1.5 ml of divinyl benzene was added and the reaction was allowed to proceed for 1 hour after which the reaction was terminated with methanol. The polymer was isolated via precipitation in excess alcohol and dried at elevated temperature under vacuum. The GPC calibrated with polystyrene led, for the collected samples, to main peak molecular weight of Mp=6400 g/mol and Mp=41690 g/mol for the final product.

Polymer Composition 2 (Ex 2)

Preparation of star branched coupled block copolymer (PMeS-PCHE)xDVB. In a thoroughly cleaned glass pressure bottle, 300 ml of purified and dried cyclohexane solvent was charged and 16 ml of sec-Buli 1.6 molar was added after which the mixture was heated to 50° C. and 5.7 gr purified and dried p-methylstyrene was added. The reaction was allowed to proceed for 45 minutes and a first small sample was collected from the solution for GPC analysis and NMR. The NMR confirmed the complete polymerization of this first monomer. Then was cooled to 30° C. and 0.4 ml 1,2-diethoxypropane was added after which 18.7 grams of purified 1,3, cyclohexadiene was added to the solution and allowed to polymerize for 2 hours. A small sample was collected from the solution for GPC and NMR analyses. The NMR confirmed the near complete polymerization of the second monomer. Then, 5.5 ml of divinyl benzene was added and the reaction was allowed to proceed for 17 hours after which the reaction was terminated with 4 ml 2-ethylhexanol and a final sample was taken. The polymer solution was transferred to a hydrogenation reactor where it was converted with a homogeneous Cobalt catalyst and hydrogen at 40 barg to 40% of the CHD olefinic species in 48 hours at 70° C. The solution was washed to remove the catalyst and stabilized with an anti-oxidant and the sample was isolated via precipitation in excess alcohol and dried at elevated temperature under vacuum. The GPC calibrated with polystyrene led, for the three respective collected samples, to main peak molecular weight of Mp=420 g/mol; Mp=1166 g/mol and Mp=44520 g/mol.

Polymer Composition 3 (Ex 3)

Preparation of star branched coupled block copolymer (PMeS-PCHE)xDVB. In a thoroughly cleaned stainless steel reactor, 1l of purified and dried cyclohexane solvent was charged and 78 ml of sec-Buli 0.51 molar was added after which the mixture was heated to 50° C. and 45 gr purified and dried p-methylstyrene was added. The reaction was allowed to proceed for 35 minutes and a first small sample was collected from the solution for GPC analysis and NMR. The NMR confirmed the complete polymerization of this first monomer. Then was cooled to 30° C. and 1.2 ml 1,2-diethoxypropane was added after which 87 grams of purified 1,3, cyclohexadiene was added to the solution and allowed to polymerize for 3.5 hours. A small sample was collected from the solution for GPC and NMR analyses. The NMR confirmed the near complete polymerization of the second monomer. Then, 17 ml of divinyl benzene was added, the mixture was heated to 60° C. and the reaction was allowed to proceed for 2.5 hours after which the reaction was terminated with 5.5 ml 2-ethylhexanol. A samples was taken and the polymer solution was transferred to a hydrogenation reactor where it was converted with a homogeneous Cobalt catalyst and hydrogen at 40 barg to 70% of the CHD olefinic species in 15 hours. The solution was washed to remove the catalyst and stabilized with an anti-oxidant and the sample was isolated via precipitation in excess alcohol and dried at elevated temperature under vacuum. The GPC calibrated with polystyrene led, for the three respective collected samples, to main peak molecular weight of Mp=1103 g/mol; Mp=4050 g/mol and Mp=108800 g/mol.

Polymer Composition 4 (Ex 4)

Preparation of linear PCHE-PS: In a dried stainless steel reactor, 5.5 liter of purified and dried cyclohexane solvent was charged heated to 30° C. and 7.3 ml 1,2-diethoxypropane was added, and 700 grams of purified 1,3, cyclohexadiene was added and then 383 ml of 0.91 molar was added to initiate the reaction and allowed to polymerize for 2.5 hours. A small sample was collected from the solution for GPC and NMR analyses. The NMR confirmed the near complete polymerization of the second monomer. Then, 300 gr of purified and dried styrene was added and the reaction was allowed to proceed for 35 minutes and a second sample was collected for GPC analysis and NMR analyses. The NMR confirmed the near complete polymerization of the third monomer. The living solution was then terminated by the addition of 11 g of methanol. The polymer solution was transferred to a hydrogenation reactor where it was converted with a homogeneous Cobalt catalyst and hydrogen at 40 barg to 90% of the CHD olefinic species in 2 hours at 80° C. The solution was washed to remove the catalyst, stabilized with an anti-oxidant and the sample was isolated via precipitation in excess alcohol and dried at elevated temperature under vacuum. The GPC calibrated with polystyrene led, for the three respective collected samples, to main peak molecular weight of Mp=2476 g/mol for the first block and Mp=4200 g/mol for the final sample. The NMR analysis of the final product led to 30 wt. % content of styrene.

Polymer Composition 5 (Ex 5)

Preparation of linear PMeS polymer. In a stainless steel reactor, 1 liter of purified and dried cyclohexane solvent was charged and 15 ml of sec-Buli 0.3 molar was added after which the mixture was heated to 60° C. and 50 gr purified and dried p-methylstyrene was added. The reaction was allowed to proceed for 30 minutes and a small sample was collected from the solution for GPC analysis and NMR. The NMR confirmed the complete polymerization of this first monomer after which the reaction was terminated with methanol. The polymer was stabilized and dried at elevated temperature under vacuum. The GPC calibrated with polystyrene led to a main peak molecular weight of Mp=13200 g/mol.

Polymer Composition 6 (Ex 6)

Preparation of linear polymer PMeS. In a glass pressure vessel, 400 ml of purified and dried cyclohexane solvent was charged and 2.5 ml of sec-Buli 0.00125 molar was added after which the mixture was heated to 50° C. and 25 gr purified and dried p-methylstyrene was added. The reaction was allowed to proceed for 2 hours and a first small sample was collected from the solution for GPC analysis and NMR. The NMR confirmed the complete polymerization of this first monomer. The polymer was isolated via precipitation in excess alcohol and dried at elevated temperature under vacuum. The GPC calibrated with polystyrene led, for the collected samples, to main peak molecular weight of Mp=22670 g/mol.

The GPC block molecular weight Mp or block ΔMp is calculated as the difference between the GPC block Mp of the linear copolymer measured at the completion of the considered block and the GPC peak molecular weight of the same linear polymer measured just before the polymerization of the considered block. The GPC is calibrated with polystyrene standards and the Mp values are thus expressed in polystyrene equivalent molecular weight.

Polymer or cured material glass transition temperature (Tg), is determined as the mid point transition temperature via differential scanning calorimetry (DSC) at the second heating ramp with +20° C./minute heating rate, measured according to ASTM D3418. The DSC thermal cycles are as following: first heating ramp from 30° C. to 200° C. at +20° C./min. Maintain 2 minutes at 200° C. then first cooling ramp: from 200° C. to 20° C. at −20° C./min. Stay 2 minutes at 20° C. and progress the second heating ramp from 20° C. to 250° C. at +20° C./min.

The copolymer based compositions are mixed according to next procedure. The copolymer and other ingredients are mixed with toluene till reaching a homogeneous and pourable solution or varnish. The solution is poured into trays coated with anti-adhesion coating and allowed to evaporate slowly overnight to form thin layer of the composition. The evaporated layer is then further dried under vacuum at 60° C. for 4 hours. The sample can be further dried at higher temperatures under vacuum. The higher drying temperature and drying time are chosen to be above the copolymer Tg but without reaching conditions leading to premature curing.

The composition curing is progressed using a Vacuum Plate Vulcanizing Machine (MDR). The sample is introduced in the machine mold preset at 110° C. (or at the copolymer Tg if this is higher) to form a plate of 0.7 mm in thickness. The mold is closed under vacuum and maintain at that temperature for 2 minutes. The mold temperature is then increased to reach 180° C. The sample is kept at 180° C. for 30 minutes of curing under vacuum. Finally the mold is cooled down to allow the collection of the cured composition. The MDR maximum torque value (expressed in dN*m) is recorded during the curing step at 180° C. and corresponds to the maximum torque recoded during that curing period. The time required to reach 90% of the maximum torque value is recorded as tc90 and expressed in minutes and seconds.

The cured samples are analyzed for gel content and swelling ratio. The cured sample initial weight is measured (Wi) before the sample is immersed in large quantity of toluene for 1 day. The solution containing the sample is then filtered and the weight of filtered swollen gel (Ws) is recorded. The swollen gel is then dried under vacuum at 60° C. until constant weight is reached that is the dried weight (Wd). The gel content (gel %) is calculated using the next formula: gel %=100*Wd/Wi. The swell ratio is calculated using the next formula: Swelling ratio=Ws/Wd.

Ingredient description: DCP: Dicumyl peroxide; BIPB: Bis-(t-butylperoxy isopropyl)benzene; TAC: Triallyl cyanurate; TAIC: Triallyl isocyanurate.

TABLE 4

Polymer compositions and comparative polymer monomer unit composition.

| Polymer | Structure | Units (i) name | Hydrogenated units (i) Mol % | Units (ii) name | Hydrogenated units (ii) Mol % | 1,4 content of units (ii) Mol % |
|---|---|---|---|---|---|---|
| Ex 1 | Star-branched | pMeS | 0 | DVB | 0 | NA |
| Ex 2 | Star-branched | pMeS | <10 | h(CHD) | 40 | <80 |
|  |  |  |  | DVB |  | NA |
| Ex 3 | Star-branched | pMeS | <10 | h(CHD) | 71 | <80 |
|  |  |  |  | DVB | ND | NA |
| Ex 4 | Linear | NA | 0 | h(CHD) | 90 | <80 |
| Ex 5 | Linear | pMeS | 0 | NA | NA | NA |
| Ex 6 | Linear | pMeS | 0 | NA | NA | NA |

Ex 4-polymer has units (iii) of styrene in which <10 mol % of the units are hydrogenated.
ND means not detected.

Hydrogenated unit has the prefix "h" before the unit. pMeS is para-methylstyrene; DVB is divinyl-benzene; CHD is 1,3-cyclohexadiene; H2(CHD) is hydrogenated cyclohexadiene; St is styrene.

TABLE 5

Polymer composition and comparative polymer monomer unit composition. Ex 4 polymer has 30 wt. % of polymerized units (iii) and block "F" content.

| Polymer | Units (i) content wt. % | Units (ii) content wt. % | Units (i) + (ii) content wt. % | Block "D" content wt. % | Block "E" content wt. % |
|---|---|---|---|---|---|
| Ex 1 | 94.7 | 5.3 | 100.0 | 94.5 | 5.3 |
| Ex 2 | 19.0 | 81.0 | 100.0 | 19 | 81 |
| Ex 3 | 30.5 | 69.5 | 100.0 | 30.5 | 69.5 |
| Ex 4 | 0.0 | 70.0 | 70.0 | — | 70 |
| Ex 5 | 100.0 | 0.0 | 100.0 | 100 |  |
| Ex 6 | 100.0 | 0.0 | 100.0 | 100 |  |

TABLE 6

Polymer composition and comparative polymer structure and properties.

| | structure | Copolymer blocks structure | Arm Mp kg/mol | CE Wt. % | polymer GPC Mp kg/mol | polymer DSC Tg ° C. |
|---|---|---|---|---|---|---|
| Ex 1 | Star-branched | [(pMeS)-(DVB)]n | 6.4 | 95.0 | 41.7 | 106 |
| Ex 2 | Star-branched | [(pMeS)-(CHE)-(DVB)]n | 1.2 | 93.0 | 44.5 | 106 |
| Ex 3 | Star-branched | [(pMeS)-(CHE)-(DVB)]n | 4.1 | 91.0 | 108.8 | 150 |
| Ex 4 | Linear | (CHE)-(St) | 4.2 | NA | 4.2 | 109 |
| Ex 5 | Linear | (pMeS) | 13.2 | NA | 13.2 | 98 |
| Ex 6 | Linear | (pMeS) | 22.7 | NA | 22.7 | 106 |

"( )" denotes a polymer block; "[ ]" denotes a polymer arm. CE: coupling efficiency

TABLE 7

Curable compositions and properties of the cured compositions.

| Example | Base Polymer | Curing agent content Wt % | Curing agent name | Tg of cured comp ° C. | Gel content in cured comp Wt % | Swell ratio of cured comp | MDR curing max torque dN · m | TGA 10% loss Temp ° C. | Curing tc90 min:s |
|---|---|---|---|---|---|---|---|---|---|
| Ex 7 | Ex 1 | 2 | BIPB | 105 | 88 | 2.96 | 4.96 | 329 | 04:50 |
| Ex 8 | Ex 2 | 2 | BIPB | 103 | 84 | 2.91 | 7.6 | 360 | 05:57 |
| Ex 9 | Ex 3 | 2 | BIPB | 132 | 81 | 2.31 | 9.52 | 335 | 05:52 |
| Ex 10 | Ex 3 | 0.5 | BIPB | 128 | 72 | 4.57 | 0.77 | 362 | 11:02 |
| Ex 11 | Ex 4 | 1 | DCP | 110 | none | NA | NA | NA | NA |
| Ex 12 | Ex 5 | 3 | DCP | 108 | 62 | NA | 0.26 | NA | 04:56 |
| Ex 13 | Ex 6 | 2 | BIPB | 102 | 99 | 7.28 | 1.67 | 333 | 07:31 |
| Ex 14 | Ex 6 | 0.5 | BIPB | 104 | none | NA | 0.05 | NA | 09:39 |

The comparative do not lead to high gel content at low curing agent addition level and even at high level. One comparative leads to high gel but despite that high gel content the cured composition is not resistant to swelling with a cured swell ratio above 5. The examples 10 to 14 show good level of curing even a low curing agent and low sell ratio show a good solvent resistance after curing.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained. It is noted that, as used in this specification and the appended claims, the singular forms "a," "an," and "the," include plural references unless expressly and unequivocally limited to one referent. As used herein, the term "include" and its grammatical variants are intended to be non-limiting, such that recitation of items in a list is not to the exclusion of other like items that can be substituted or added to the listed items.

As used herein, the term "comprising" means including elements or steps that are identified following that term, but any such elements or steps are not exhaustive, and an embodiment can include other elements or steps. Although the terms "comprising" and "including" have been used herein to describe various aspects, the terms "consisting essentially of" and "consisting of" can be used in place of "comprising" and "including" to provide for more specific aspects of the disclosure and are also disclosed.

Unless otherwise specified, all technical and scientific terms used herein have the same meanings as commonly understood by one of skill in the art to which the disclosed disclosure belongs. the recitation of a genus of elements, materials or other components, from which an individual component or mixture of components can be selected, is intended to include all possible sub-generic combinations of the listed components and mixtures thereof.

The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims. To an extent not inconsistent herewith, all citations referred to herein are hereby incorporated by reference.

The invention claimed is:

1. A polymer composition comprising a star-branched block copolymer having one or more configurations selected from the group consisting of (D-E-)$_n$X, (E-D-)$_n$X, (D-E-D-)$_n$X, (D-F-E-)nX, (D-E-F-)nX, (E-F-D-)nX, and (E-D-F-)nX; wherein "n" is an integer from 3 to 50, and X is a coupling agent residue;
   wherein the star-branched block copolymer has a plurality of polymer arms, each polymer arm having a peak molecular weight of from 1 kg/mol to 50 kg/mol, and
   wherein each polymer arm comprises one or more polymer blocks "D" comprising >50 wt. % of polymerized units (i) derived from a first vinyl aromatic monomer, wherein from greater than 10 mol % to 100 mol % of polymerized units (i) are unhydrogenated;
   one or more polymer blocks "E" comprising >50 wt. % of polymerized unit (ii) which comprises
      (a) hydrogenated and unhydrogenated forms of polymerized units derived from a high Tg monomer, and (b) hydrogenated form of polymerized units (i) or hydrogenated form of polymerized styrene units; and optionally one or more polymer blocks "F" comprising >50 wt. % of polymerized unit (iii) which comprises:
(a) polymerized units derived from one or more acyclic conjugated dienes, wherein less than 10 wt. % of the polymerized units are unhydrogenated; and
(b) polymerized units derived from one or more of a second vinyl aromatic monomer; and
wherein the high Tg monomer is selected from the group consisting of tert-butyl styrene, 1,3 cyclohexadiene, 1,3-cycloheptadiene, benzofulvene, 1,1-diphenylethylene, vinyl biphenyl, adamantyl styrene, vinylanthracene, divinylbenzene, bis(vinylphenyl)ethane, and combinations thereof, and the polymerized units derived from 1,3-cyclohexadiene comprise 1,2-and 1,4-addition units in a relative mole ratio of from 90:10 to 10:90;

wherein the copolymer contains more than 10 wt. % of polymerized units (i), the polymerized units (i) and (ii) together constitute more than 80 wt. % of the overall weight of the copolymer;

wherein the copolymer has a peak molecular weight of from 15 kg/mol to 500 kg/mol, and a glass transition temperature of from more than 100° C. to 250° C.;

wherein the one or more polymer blocks "D" comprise polymerized para-methylstyrene units.

2. The polymer composition of claim 1, further comprising one or more polymer blocks "E", wherein the polymerized units (ii) comprise hydrogenated form of polymerized units derived from 1,3-cyclohexadiene, para-methylstyrene, or divinylbenzene.

3. The polymer composition of claim 1, further comprising one or more polymer blocks "F", wherein the polymerized units (iii) comprise polymerized units derived from styrene, and polymerized units derived from butadiene or isoprene.

4. The polymer composition of claim 1, wherein the star-branched block copolymer has a total peak molecular weight from 25 kg/mol to 300 kg/mol; and wherein each of the plurality of polymer arms has a peak molecular weight from 1 kg/mol to 30 kg/mol.

5. The polymer composition of claim 1, wherein the polymer composition has a dielectric constant Dk of less than 3, measured at 1 GHz; and a dissipation factor Df of less than 0.002, measured at 1 GHz.

6. A curable composition comprising a polymer composition comprising:
a star-branched block copolymer having a plurality of polymer arms,
wherein each polymer arm has a peak molecular weight of from 1 kg/mol to 50 kg/mol, and wherein each polymer arm comprises
polymerized units (i) derived from a first vinyl aromatic monomer,
wherein the polymerized unit (i) comprises a radical-reactive group,
wherein from greater than 10 mol % to 100 mol % of polymerized units (i) are unhydrogenated;
polymerized units (ii), comprising
(a) hydrogenated and unhydrogenated forms of polymerized units derived from a high Tg monomer, and
(b) hydrogenated form of polymerized units (i) or hydrogenated form of polymerized styrene units; and
optionally, polymerized units (iii), comprising
(a) polymerized units derived from one or more acyclic conjugated dienes, wherein less than 10 wt. % of the polymerized units are unhydrogenated; and
(b) polymerized units derived from one or more of a second vinyl aromatic monomer;
wherein the copolymer contains more than 10 wt. % of polymerized units (i), the polymerized units (i) and (ii) together constitute more than 80 wt. % of the overall weight of the copolymer;
wherein the polymerized units (ii) is present in an amount of more than 1 wt. %, relative to the overall weight of the polymer composition;
wherein the high Tg monomer is selected from the group consisting of tert-butyl styrene, 1,3 cyclohexadiene, 1,3-cycloheptadiene, benzofulvene, 1,1-diphenylethylene, vinyl biphenyl, adamantyl styrene, vinylanthracene, divinylbenzene, bis(vinylphenyl)ethane, and combinations thereof, and the polymerized units derived from 1,3-cyclohexadiene comprise 1,2- and 1,4-addition units in a relative mole ratio of from 90:10 to 10:90;
wherein the copolymer has a peak molecular weight of from 15 kg/mol to 500 kg/mol, and a glass transition temperature of from more than 100° C. to 250° C.;
a curing agent,
a co-curing agent, and
optionally one or more additives.

7. The curable composition of claim 6, wherein the curing agent is an organic peroxide, in an amount of 0.1 parts to 5 parts, per 100 parts of the curable composition.

8. The curable composition of claim 6,
wherein the co-curing agent is selected from the group consisting of divinylbenzene, 1,2-bis(vinylphenyl)ethane, triallyl cyanurate, triallyl isocyanurate, vinyl functionalized polyphenylene ether resin, bismaleimide resin, and liquid or solid diene-based polymer; and
wherein the additive is selected from the group consisting of fillers, fire retardants, polyolefins having a glass transition temperature of 100° C.-200° C., aromatic resins, rubber, antioxidants, UV stabilizers, UV radical initiators, anti-shrink additives, adhesion promoters, colorants, and combinations thereof.

9. A formulation comprising the curable composition of claim 6 and a solvent.

10. The formulation of claim 9, wherein the formulation has from 10 wt. % to 60 wt. % of the curable composition, and wherein said formulation has a solution viscosity of less than 2000 cP, measured at 25° C. at 25 wt. % of the formulation in toluene.

11. A tire rubber formulation comprising the curable composition of claim 6.

* * * * *